US012712034B2

(12) United States Patent
Kaynak et al.

(10) Patent No.: US 12,712,034 B2
(45) **Date of Patent: *Aug. 18, 2026**

(54) MANAGING PROGRAM VERIFY VOLTAGE OFFSETS FOR CHARGE COUPLING AND LATERAL MIGRATION COMPENSATION IN MEMORY DEVICES

(71) Applicant: Micron Technology, Inc., Boise, ID (US)

(72) Inventors: Mustafa N. Kaynak, San Diego, CA (US); Patrick R. Khayat, San Diego, CA (US); Sivagnanam Parthasarathy, Carlsbad, CA (US)

(73) Assignee: Micron Technology, Inc., Boise, ID (US)

( * ) Notice: Subject to any disclaimer, the term of this patent is extended or adjusted under 35 U.S.C. 154(b) by 77 days.

This patent is subject to a terminal disclaimer.

(21) Appl. No.: 18/753,717

(22) Filed: Jun. 25, 2024

(65) Prior Publication Data

US 2024/0347119 A1 Oct. 17, 2024

Related U.S. Application Data

(63) Continuation of application No. 17/860,711, filed on Jul. 8, 2022, now Pat. No. 12,046,307.

(60) Provisional application No. 63/348,307, filed on Jun. 2, 2022.

(51) Int. Cl.

| | |
|---|---|
| ***G11C 11/00*** | (2006.01) |
| ***G11C 16/04*** | (2006.01) |
| ***G11C 16/10*** | (2006.01) |
| ***G11C 16/34*** | (2006.01) |

(52) U.S. Cl.
CPC ...... *G11C 16/3459* (2013.01); *G11C 16/0483* (2013.01); *G11C 16/10* (2013.01)

(58) Field of Classification Search
CPC .. G11C 16/3459; G11C 16/0483; G11C 16/10
See application file for complete search history.

(56) References Cited

U.S. PATENT DOCUMENTS

| | | | |
|---|---|---|---|
| 12,046,307 B2 * | 7/2024 | Kaynak | G11C 16/0483 |
| 2007/0291546 A1 | 12/2007 | Kamei | |
| 2008/0019188 A1 | 1/2008 | Li | |

(Continued)

*Primary Examiner* — Pho M Luu
(74) *Attorney, Agent, or Firm* — Lowenstein Sandler LLP

(57) ABSTRACT

A system includes a memory device and a processing device to perform operations that include identifying wordline groups where each wordline group is associated with a corresponding default program verify (PV) voltage for each programming level, and determining, for each wordline group, a maximum read window budget (RWB) increase. They can further include defining a target aggregate RWB increase amount based on the maximum RWB increase, and determining, for each wordline group, a minimum number of memory cell programming level groups with corresponding PV voltage offsets sufficient to reach the target aggregate RWB increase amount. The embodiments can also include grouping the programming levels of a specified memory cell into the minimum number of programming level, and applying, based on the specific programming level group containing a target programming level, a corresponding PV voltage offset during a memory cell access operation.

20 Claims, 7 Drawing Sheets

(56) References Cited

U.S. PATENT DOCUMENTS

| | | | | |
|---|---|---|---|---|
| 2008/0056007 | A1 | 3/2008 | Kang et al. | |
| 2009/0285024 | A1* | 11/2009 | Kang | G11C 16/3454 365/185.18 |
| 2013/0235666 | A1 | 9/2013 | Sakamoto et al. | |
| 2019/0088341 | A1* | 3/2019 | Jung | G11C 16/34 |
| 2021/0383879 | A1* | 12/2021 | Lin | G11C 16/26 |

* cited by examiner

300

IDENTIFY WORDLINE GROUPS ON THE MEMORY DEVICE, WHERE EACH WORDLINE GROUP IS ASSOCIATED WITH A CORRESPONDING DEFAULT PROGRAM VERIFY (PV) VOLTAGE FOR EACH RESPECTIVE PROGRAMMING LEVEL OF A MEMORY CELL 302

DETERMINING, FOR EACH WORDLINE GROUP, A MAXIMUM READ WINDOW BUDGET (RWB) INCREASE ASSOCIATED WITH USING A DIFFERENT PROGRAM VERIFY (PV) VOLTAGE OFFSET FOR EACH RESPECTIVE PROGRAMMING LEVEL OF A MEMORY CELL OF THE PLURALITY OF MEMORY CELLS, WHERE EACH PV VOLTAGE OFFSET DEPENDS ON A RESPECTIVE AGGRESSOR MEMORY CELL THRESHOLD VOLTAGE 304

DEFINING A TARGET AGGREGATE RWB INCREASE AMOUNT BASED ON THE MAXIMUM RWB INCREASE 306

DETERMINING, FOR EACH WORDLINE GROUP, A MINIMUM NUMBER OF MEMORY CELL PROGRAMMING LEVEL GROUPS, EACH PROGRAMMING LEVEL GROUP ASSOCIATED WITH A CORRESPONDING PV VOLTAGE OFFSET APPLIED FOR PROGRAMMING A MEMORY CELL TO ANY PROGRAMMING LEVEL WITHIN THE PROGRAMMING LEVEL GROUP, WHERE THE MINIMUM NUMBER IS SUFFICIENT TO REACH THE TARGET AGGREGATE RWB INCREASE AMOUNT 308

GROUPING THE PROGRAMMING LEVELS OF A SPECIFIED MEMORY CELL INTO THE MINIMUM NUMBER OF PROGRAMMING LEVEL GROUPS DETERMINED FOR THE WORDLINE GROUP CONTAINING THE WORDLINE CONNECTED TO THE SPECIFIED MEMORY CELL TO DEFINE ONE OR MORE SPECIFIC PROGRAMMING LEVEL GROUPS 310

APPLYING, BASED ON THE SPECIFIC PROGRAMMING LEVEL GROUP CONTAINING A TARGET PROGRAMMING LEVEL, A CORRESPONDING PV VOLTAGE OFFSET DURING A MEMORY CELL ACCESS OPERATION TO PROGRAM THE SPECIFIED MEMORY CELL TO THE TARGET PROGRAMMING LEVEL 312

FIG. 3

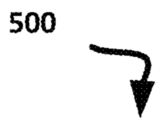

DETERMINING, FOR A WORDLINE GROUP OF A MEMORY DEVICE, A MAXIMUM READ WINDOW BUDGET (RWB) INCREASE ASSOCIATED WITH USING A DIFFERENT PROGRAM VERIFY (PV) VOLTAGE OFFSET FOR EACH DEVIATION OF A RESPECTIVE PROGRAMMING LEVEL VOLTAGE THRESHOLD OF A MEMORY CELL, WHERE EACH DEVIATION DEPENDS ON A RESPECTIVE AGGRESSOR MEMORY CELL THRESHOLD VOLTAGE 502

DEFINING A TARGET AGGREGATE RWB INCREASE AMOUNT BY A PORTION OF THE MAXIMUM RWB INCREASE 504

DETERMINING, FOR THE WORDLINE GROUP, A MINIMUM NUMBER OF MEMORY CELL PROGRAMMING LEVEL GROUPS SUFFICIENT TO REACH THE TARGET AGGREGATE RWB INCREASE AMOUNT 506

IDENTIFYING ONE OR MORE MEMORY CELL PROGRAMMING LEVEL GROUPS INTO WHICH THE PROGRAMMING LEVELS OF A SPECIFIED MEMORY CELL CAN BE DIVIDED SUCH THAT A TOTAL NUMBER OF MEMORY CELL PROGRAMMING LEVEL GROUPS IS THE MINIMUM NUMBER OF MEMORY CELL PROGRAMMING LEVEL GROUPS DETERMINED FOR THE WORDLINE GROUP CONTAINING THE WORDLINE TO WHICH THE SPECIFIED MEMORY CELL IS CONNECTED 508

PERFORMING A MEMORY CELL ACCESS OPERATION, BASED ON THE PROGRAMMING LEVEL GROUP CONTAINING A TARGET PROGRAMMING LEVEL, USING A CORRESPONDING PV VOLTAGE OFFSET, TO PROGRAM THE SPECIFIED MEMORY CELL TO THE TARGET PROGRAMMING LEVEL 510

FIG. 5

MANAGING PROGRAM VERIFY VOLTAGE OFFSETS FOR CHARGE COUPLING AND LATERAL MIGRATION COMPENSATION IN MEMORY DEVICES

RELATED APPLICATIONS

This application is a continuation of U.S. patent application Ser. No. 17/860,711, filed Jul. 8, 2022, issued Jul. 23, 2024 as U.S. Pat. No. 12,046,307, which claims the benefit of U.S. Provisional Patent Application No. 63/348,307, filed Jun. 2, 2022, entitled "Managing Program Verify Voltage Offsets for Charge Coupling and Lateral Migration Compensation in Memory Devices." Both above-identified applications are incorporated by reference herein.

TECHNICAL FIELD

Embodiments of the disclosure relate generally to memory sub-systems, and more specifically, relate to managing program verify (PV) voltage offsets for compensation of charge coupling and lateral migration effects in memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 3 is a flow diagram of an example method for managing program verify (PV) voltage offsets in accordance with some embodiments of the present disclosure;

FIG. 5 is a flow diagram of an example method for managing PV voltage offsets in accordance with some embodiments of the present disclosure.

DETAILED DESCRIPTION

Figure 1:
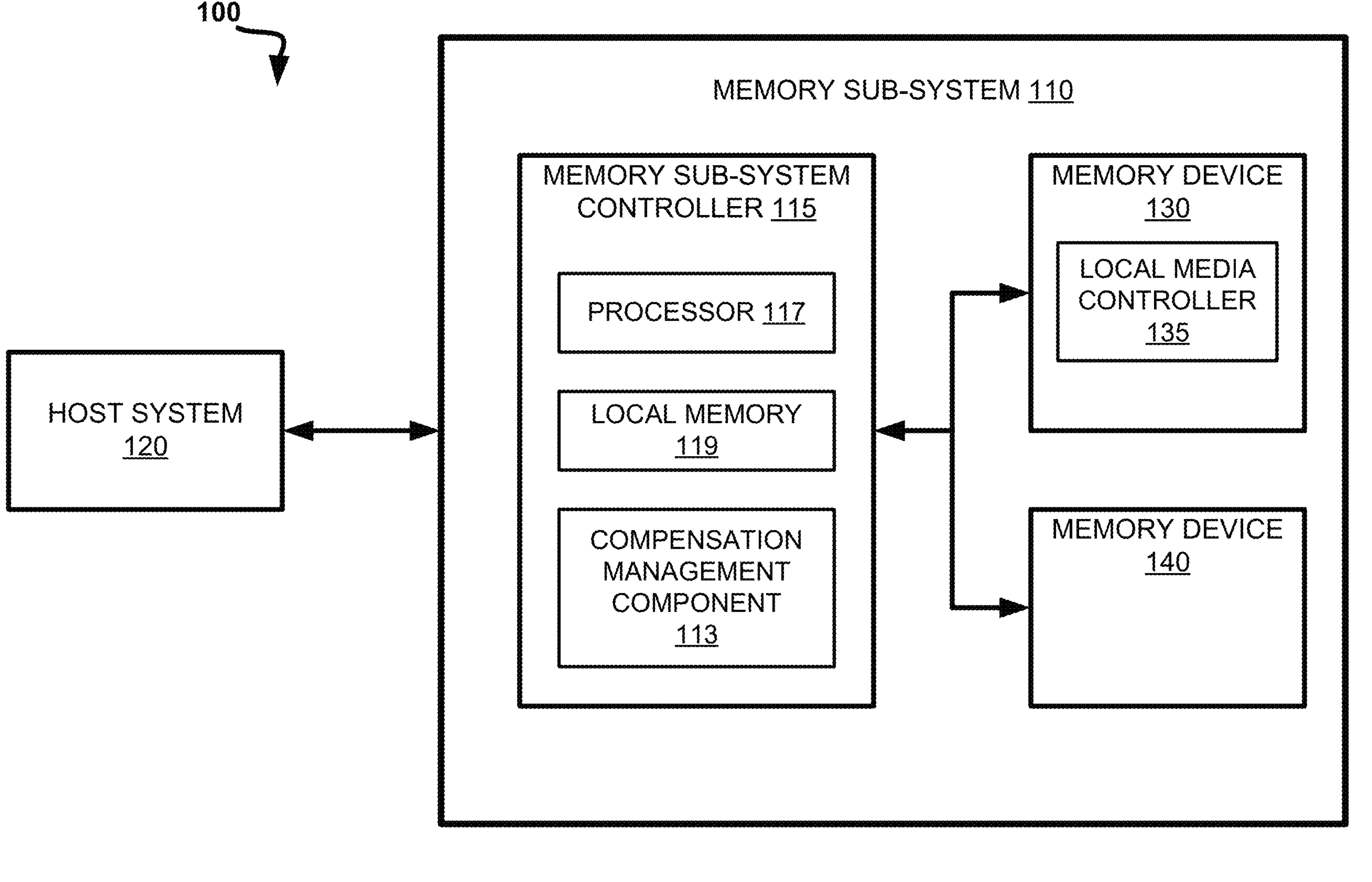
FIG. 1 illustrates an example computing system that includes a memory sub-system in accordance with some embodiments of the present disclosure.

Aspects of the present disclosure are directed to managing program verify (PV) voltage offsets for compensation of charge coupling and lateral migration effects in memory devices. A memory sub-system can be a storage device, a memory module, or a combination of a storage device and memory module. Examples of storage devices and memory modules are described below in conjunction with FIGS. 1-2A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIGS. 1-2A. A non-volatile memory device is a package of one or more dies. Each die can consist of one or more planes. For some types of non-volatile memory devices (e.g., NAND devices), each plane includes a set of physical blocks. Each block includes a set of pages. Each page includes a set of memory cells ("cells"). A memory cell is an electronic circuit that stores information. Depending on the memory cell type, a memory cell can store one or more bits of binary information, and has various logic states that correlate to the number of bits being stored. The logic states can be represented by binary values, such as "0" and "1", or combinations of such values.

A memory device includes multiple memory cells arranged in a two-dimensional or three-dimensional grid. Memory cells are formed on (e.g., etched onto) a silicon wafer in an array of columns connected by conductive lines (also hereinafter referred to as bitlines) and rows connected by conductive lines (also hereinafter referred to as wordlines). A wordline can refer to a conductive line that connects control gates of a set (e.g., one or more rows) of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells addressable by one or more wordlines. One or more blocks can be grouped together to form separate partitions (e.g., planes) of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types. In another example, the memory device can include multiple access line driver circuits and power circuits that can be shared by the planes of the memory device. For ease of description, these circuits can be generally referred to as independent plane driver circuits. Depending on the storage architecture employed, data can be stored across the memory planes (i.e., in stripes). Accordingly, one request to read a segment of data (e.g., corresponding to one or more data addresses), can result in read operations performed on two or more of the memory planes of the memory device.

A memory cell ("cell") can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage $V_t$ (also referred to as the "threshold voltage") such that the source-drain electric current is low for the control gate voltage ($V_{CG}$) being below the threshold voltage, $V_{CG}<V_t$. The current increases substantially once the control gate voltage has exceeded the threshold voltage, $V_{CG}>V_t$. Because the actual geometry of the electrodes and gates varies from cell to cell, the threshold voltages can be different even for cells implemented on the same die. The cells can, therefore, be characterized by a distribution P of the threshold voltages, $P(Q, V_t)=dW/dV_t$, where dW represents the probability that any given cell has its threshold voltage within the interval $[V_t, V_t+dV_t]$ when charge Q is placed on the cell.

A programming operation can be performed by applying a series of incrementally increasing programming pulses that to the control gate of a memory cell being programmed. A program verify operation after each programming pulse determines the threshold voltage of the memory cell resulting from the preceding programming pulse. When memory cells are programmed, the level of the programming achieved in a cell (e.g., the $V_t$ of the cell) is verified, in effect, by comparing the cell $V_t$ to a target (i.e., desired) program verify (PV) voltage level. The PV voltage level can be provided by an external reference.

A typical program verify operation includes determining a target threshold voltage and applying a ramped voltage to the control gate of the memory cell being verified. When the ramped voltage reaches the threshold voltage to which the memory cell has been programmed, the memory cell turns on and sense circuitry detects a current on a bit line coupled to the memory cell. The detected current activates the sense circuitry to compare whether the present threshold voltage is greater than or equal to the stored target threshold voltage. If the present threshold voltage is greater than or equal to the target threshold voltage, further programming is inhibited. Otherwise, Programming typically continues in this manner with the application of additional program pulses to the memory cell until the target PV of a corresponding $V_t$ and data state is achieved.

Accordingly, certain non-volatile memory devices can use a demarcation voltage (i.e., a read reference voltage) to read data stored at memory cells. For example, a read reference voltage can be applied to the memory cells, and if a threshold voltage of a specified memory cell is identified as being below the read reference voltage that is applied to the specified memory cell, then the data stored at the specified memory cell can be read as a particular value (e.g., a logical '1') or determined to be in a particular state (e.g., a set state). If the threshold voltage of the specified memory cell is identified as being above the read reference voltage, then the data stored at the specified memory cell can be read as another value (e.g., a logical '0') or determined to be in another state (e.g., a reset state). Thus, the read reference voltage can be applied to memory cells to determine values stored at the memory cells. Such threshold voltages can be within a range of threshold voltages or comprise a normal distribution of threshold voltages.

A memory device can exhibit threshold voltage distributions $P(Q, V_t)$ that are narrow compared with the working range of control voltages tolerated by the cells of the device. Accordingly, multiple non-overlapping distributions $P(Q_k, V_t)$ ("valleys") can be fit into the working range allowing for storage and reliable detection of multiple values of the charge $Q_k$, k=1, 2, 3 . . . . The distributions (valleys) are interspersed with voltage intervals ("valley margins") where none (or very few) of the cells of the device have their threshold voltages. Such valley margins can, therefore, be used to separate various charge states $Q_k$—the logical state of the cell can be determined by detecting, during a read operation, between which two valley margins the respective threshold voltage $V_t$ of the cell resides. This effectively allows a single memory cell to store multiple bits of information: a memory cell operated with 2N−1 well-defined valley margins and 2N valleys is capable of reliably storing N bits of information. Specifically, the read operation can be performed by comparing the measured threshold voltage $V_t$ exhibited by the memory cell to one or more reference voltage levels corresponding to known valley margins (e.g., centers of the margins) of the memory device in order to distinguish between the multiple logical programming levels and determine the programming state of the cell.

One type of cell is a single level cell (SLC), which stores 1 bit per cell and defines 2 logical states ("states") ("1" or "L0" and "0" or "L1") each corresponding to a respective $V_t$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_t$ level. For example, the "11" state can be an erased state and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_t$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell can use $2^n$ levels of charge to store n bits. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of cells.

A valley margin can also be referred to as a read window (i.e., a size measured in volts, representing the distance, on a voltage scale, between a $V_t$ distribution associated with one programming level and a $V_t$ distribution associated with a subsequent programming level). For example, in a SLC cell, there is one read window that exists with respect to the two $V_t$ distributions. Analogously, in an MLC cell, there are three read windows that exist with respect to the four $V_t$ distributions. Similarly, in a TLC cell, there are seven read windows that exist with respect to the eight $V_t$ distributions.

Read window size generally decreases as the number of states increases. For example, the one read window for the SLC cell may be larger than each of the three read windows for the MLC cell, and each of the three read windows for the MLC cell may be larger than each of the seven read windows for the TLC cell, etc. Read window budget (RWB) refers to the cumulative value of the read windows (i.e., the total size of all the read windows of a set of memory cells).

Cells of a memory array that are to be read during a read operation can be referred to specified cells (i.e., target cells) connected to a target wordline. The specified cells can neighbor adjacent cells connected to at least one wordline neighboring the specified wordline ("adjacent wordline" i.e., the wordline to which the specified cell is connected). For example, the at least one adjacent wordline can be a single wordline neighboring the specified wordline or a pair of wordlines neighboring the target wordline. Illustratively, the specified wordline can be referred to as an n-th wordline ($WL_n$), and the at least one adjacent wordline can include at least one of adjacent wordline n−1 ($WL_{n-1}$) or adjacent wordline n+1 ($WL_{n+1}$). For example, in a 3D memory device, the set of adjacent wordlines can include a wordline located directly above the target wordline and/or a wordline located directly below the target wordline.

Accordingly, each specified cell can have a respective group of adjacent cells. Each group of adjacent cells can include at least one cell that neighbors its respective specified cell (e.g., one cell connected to $WL_{n-1}$ and/or one cell connected to $WL_{n+1}$). More specifically, each specified cell can be connected to the same bitline as each cell of the respective group of adjacent cells, such that the specified cell and the cells of the respective group of adjacent cells are within the same string (i.e., connected in a string by same bitline). Accordingly, each group of adjacent cells can include a single adjacent cell, or a pair of adjacent cells connected to a same bitline as a respective specified cell.

Some memory devices are subject to physical phenomena that affect the charge stored in their cells and consequently, also affect the respective threshold voltages of the cells. These phenomena can arise in a memory array between one or more specified cells and their respective groups of adjacent cells. Such phenomena include, e.g., cell-to-cell coupling (i.e., capacitive coupling between cells that causes interference) and lateral migration (i.e., charge migration between adjacent cells). Cell-to-cell coupling between cells occurs due to capacitive coupling between charge storage structures (e.g., transistors) of adjacent memory cells. For example, the $V_t$ of a specified cell programmed to a target state (e.g., a particular programming level) can change due to capacitive coupling associated with transistors of adjacent cells. The amount of $V_t$ change (i.e., $V_t$ shift), of the specified cell due to cell-to-cell coupling can depend on the $V_t$ of one or more adjacent cells. For instance, adjacent cells programmed to a higher programming level (i.e., a state associated with a higher $V_t$) may have a greater effect on the $V_t$ of the specified cell than adjacent cells programmed to a lower programming level (i.e., a state associated with a lower $V_t$). In some instances, the $V_t$ shift of a specified cell caused by the programming of an adjacent cell, can lead to erroneous sensing (e.g., during a memory access operations) of the specified cell.

Lateral migration can have analogous effects. For example, after a cell adjacent to a specified cell is programmed, the electrons can diffuse laterally (i.e., along the wordline) from the charge storage structure of the adjacent cell toward the charge storage structures of the specified cell by tunneling through intervening layers between them. Moreover, this diffusion can depend on (i.e., may be a function of) the respective programming level of neighboring cells connected to the same bitline as the specified cell. Consequently, lateral migration of charge (i.e., as a function of time and of the programming levels of the adjacent cells on the bitline) from an adjacent cell on the wordline can also shift the $V_t$ of the specified cell due to the loss of charge (i.e., electrons) that was previously present.

Accordingly, both cell-to-cell coupling and lateral migration can lead to significant $V_t$ shifts which can depend on the programming level of adjacent cells along the bitline of a specified cell. For example, the shift can be sufficient to cause a memory access operations performed on the specified cell to result in a determined sensed state other than the one associated with the programming level of the specified cell. Consequently, for a given programming level, the cells in the memory device can be characterized by multiple $V_t$ sub-distributions with each sub-distribution being associated with (e.g., caused by) a particular programming level of an adjacent cell (e.g., via one of the aforementioned phenomena). The mean of each of these distributions will be shifted from the default $V_t$ for a given programming level by an amount correlated with the programming level of the corresponding group of adjacent cell(s). Thus, when these effects are considered for a multiple cells in one or more memory arrays on a memory device, these phenomena can result in a lowering and widening of the $V_t$ distribution for any programmed state and therefore impair the ability to accurately read the cells. The $V_t$ distribution widening can, in turn, cause RWB degradation and negatively affect memory device reliability. For example, RWB degradation can lead to an increase in the number of errors (e.g., bit errors) and/or error rate (e.g., bit error rate (BER)).

More specifically, cell-to-cell coupling and lateral migration can entail a change in $V_t$ of one transistor (e.g., of a memory cell) influencing the $V_t$ of one or more neighboring transistors (e.g., of a neighboring memory cell) to shift through a parasitic capacitance-coupling effect. These $V_t$ shifts disadvantageously result in an expansion of the corresponding $V_t$ distributions (i.e., of multiple cells in an array) in order to accommodate all possible threshold voltages for a given state and further results in a reduction of the RWB corresponding to the programming distributions associated with the various programming levels. Notably, the RWB can refer to the cumulative value (e.g., in voltage) of a number (e.g., seven) of distances (e.g., measured in voltage) between adjacent threshold voltage distributions at a particular BER. For the purposes of this disclosure, in the context of cell-to-cell coupling and lateral migration phenomena, a cell whose $V_t$ is affected by the programming level of a neighboring cell can be referred to herein as a "victim" cell. Analogously, in the same context, a cell whose programming level affects the $V_t$ of a neighboring cell can be referred to herein as an "aggressor" cell.

In some situations, the effects of cell-to-cell coupling and lateral migration can be mitigated by adjusting voltage levels utilized for read operations or programming (i.e., write) operations that are performed on the cells of the memory device. More specifically, adjustments can be made to voltages applied to a cell in the course of read operations and write operations to compensate for the multiple shifted $V_t$ sub-distributions created due to the effects of corresponding programming levels of one or more adjacent aggressor cells. These adjusted voltages (e.g., a read reference voltage or a program-verify voltage) applied in the course of such memory access operations can be offset (e.g., in an opposite direction) relative to the $V_t$ of a specified cell to counteract the effects of cell-to-cell coupling and lateral migration. In general, each possible $V_t$ shift of a specified memory cell caused by one or more adjacent aggressor cell's programming level can be accounted by shifting the means (i.e., mathematical averages) of the resulting $V_t$ sub-distributions closer together or even by aligning them completely. This alignment can be achieved during programming of the cell by applying offset programming voltage pulses and PV voltages to the cell such that the resulting $V_t$ of the cell aligns with the desired target value due to effect of cell-to-cell coupling and lateral migration. Similarly, an alignment of sensed $V_t$ can be achieved when reading a cell by offsetting a read reference voltage such that the perceived sensed state's $V_t$ aligns with the desired target value after the effect of cell-to-cell coupling and lateral migration is considered. Accordingly, the respective means of the sub-distributions can be shifted and aligned by applying one or more adjusted voltages to the specified memory cell during a memory access operation. Shifting the means of the sub-distributions closer together compensates for the widening of the overarching distribution for a given specified cell programming level caused by cell-to-cell coupling and lateral migration effects of the aggressor memory cells.

Perfect compensation, for a particular programming level of a specified cell, can be achieved by aligning the means of all of the possible sub-distributions to account for all the possible corresponding $V_t$ shifts caused by cell-to-cell coupling and lateral migration effects of the aggressor memory cells. Accordingly, perfect compensation narrows the spread of the $V_t$ sub-distributions and thereby narrows the overarching $V_t$ distribution for a given programming level to enlarge one or more read windows and result in an increased RWB for a set of memory cells. As used herein, for a set of cells including a victim cell and one or more adjacent aggressor cells, "perfect compensation" refers to precise compensation for each of the possible specific cell-to-cell coupling and lateral migration effects on the victim cell. In other words, "perfect compensation" refers to an adjustment of an operation parameter that compensates for all of the possible victim cell $V_t$ shifts that can be caused by any of the corresponding programming states/levels to which the adjacent aggressor cells can be programmed.

However, the number and the parameters of the adjustments to the voltages applied during a memory cell access operation to compensate for the aforementioned effects can vary depending on multiple factors. For example, (i) the geometry of the array of memory cells; (ii) the sensitivity of a victim memory cells to an aggressor cell state; (iii) the programming level of a victim cell, (iv) the programming level of an aggressor cell, (v) the desired (i.e., target) RWB, the (vi) amount (e.g., in bits) of information about the aggressor cell programming levels that is to be used; (vii) the amount of energy used; and (vii) the amount of time used can each determine how a memory cell access operation is modified to compensate for the cell-to-cell coupling and lateral migration effects. Accordingly, the modification of the default parameters (e.g., adjustment of applied voltage levels) of the memory cell access operation can be tailored to achieve a desired RWB increase based on constraints relating to one or more of the aforementioned factors. The modifications of these parameters can depend on determining the programming levels of the specified cell and the neighboring cell in order to select an appropriate adjustment that accurately compensates for the effects on the specified cell.

Therefore, modifying the memory access operation can entail having to perform multiple operations on the specified cell and adjacent cells to determine the parameter adjustments that would accurately compensate for the cell-to-cell coupling and lateral migration effects. Due to this, the level of precision that is needed to determine the aggressor cell programming levels is directly correlated with the time it takes to make that determination. Accordingly, achieving a large RWB increase can require a proportionally longer amount of time. Similarly, the number of possible programming states that a cell can be programmed to is directly correlated with the number of bits of information needed to accurately reflect those states for making a corresponding modification based on that information. Therefore, achieving a large RWB increase can require accurate representation of the memory cell state information that uses a large number of bits to reflect the precisely determined programming states.

In some cases, all the possible shifts caused by the various possible states (i.e., programming levels) of one or more aggressor memory cell may need to be accounted for to achieve perfect compensation for a specified cell and thereby achieve a maximum possible increase in the RWB. However, this can often be an extremely resource intensive approach due to the additional operations needed to determine the modified parameters (e.g., adjusted voltages) for use with the memory access operation. Consequently, perfect compensation of these effects leads to increased time (e.g., tRead or tProg) needed to complete respective modified read or write operations and can significantly delay the transmission of data to or from the host device. Additionally, storing a large number of adjustments and parameter modifications to compensate for all of the potential shifts in the victim cells requires a proportionally large portion of memory allocating for storing these values. In fact, the memory space required to store the values of the parameters that adjust the default memory operations will increase exponentially relative to the number of cells and number of programming levels that each cell can be programmed to. However, in many cases it might not be necessary to obtain a maximum possible increase in RWB to achieve a desired performance improvement (e.g., decreased BER). For example, it may be the case that a lower increase in RWB is sufficient to achieve a target improvement in BER without needing to incur additional resource and time costs associated with perfect compensation. This lower, but still sufficient, RWB increase can be achieved with fewer adjustments than those needed for perfect compensation. Accordingly, in such situations perfect compensation wastes time and resources and detrimentally increases data transfer latency between the memory device and host device.

Aspects of the present disclosure address the above and other deficiencies by modifying parameters of memory access operations (e.g., corrective programming/write operations, also referred to herein as "pre-compensation") in order to compensate for cell-to-cell (C2C) coupling and lateral migration (LM) effects with achieving a desired RWB increase. The various embodiments described herein facilitate obtaining sufficient RWB gains without expending more computing resources than necessary to compensate for the aforementioned detrimental C2C coupling and LM effects. In the embodiments, this is accomplished by determining the number of programming level groups that are used for adjusting the parameters of a memory access operation to achieve a target RWB increase. As noted above, the particular adjustments and resulting gain in the RWB can depend on a variety of interrelated factors representative of the physical properties of the constituent elements of a memory device and of its desired performance characteristics.

Taking these factors into consideration, the embodiments of the present disclosure include components that target an RWB gain that is sufficient to overcome the C2C coupling and LM effects causing errors on the memory device without resorting to perfect compensation that achieves the maximum possible RWB gain. To do this, for a given amount (in bits) of aggressor memory cell information (i.e., information reflecting the programming state of one or more aggressor memory cells), some embodiments include components that determine the minimum number of groups into which the programming level of the cells connected to a particular set of wordlines should be grouped into to achieve the desired RWB increase. Note that more bits are required for a more precise representation of an aggressor cell programming level/state. Furthermore, these bits of information can be used to make corresponding adjustments to memory access operation parameters to increase the RWB. For example, n bits of information express $2^n$ different memory cell programming states. Accordingly, since each possible aggressor memory cell programming level can have a different respective effect on the $V_t$ of a specified victim memory cell, each of those aggressor memory cell programming levels can be compensated for with a corresponding modification of a parameter of a corrective write operation (e.g., an adjusted/offset PV voltage) associated with that accounts for the effect. Additionally, different wordlines that connect cells within an array on a memory device can have different physical properties (e.g., resistance) that require different default PV voltages to be used to program the cells on those wordlines to a particular programming level. Thus, embodiments of the present disclosure can include components that group the wordlines into wordline groups based on the default PV that is used to program the cells on those wordlines to a particular programming level.

Further, various embodiments can include components that determine the maximum RWB increase (e.g., the RWB increase associated with perfect compensation) and identify a target RWB increase that is desired to be achieved for a group of cells connected to one of the wordline groups. For example, the target RWB increase can be defined in terms of a distance (in volts) of a RWB increase resulting from a particular adjustment relative to the maximum RWB increase resulting from perfect compensation (e.g., within K mV of the maximum RWB increase). Similarly, the target RWB increase can be defined in terms of a percentage or proportion of the maximum RWB increase (e.g., within a 25% of the maximum RWB increase, i.e., no less than ¾ of the maximum RWB increase). The embodiments of the present disclosure, can include components that then begin checking the programming level groupings to see which grouping is sufficient to achieve the target RWB increase.

Various embodiments can include components that initially group all the programming levels of a specified cell into one group with a corresponding PV voltage offset. For example, in a situation where 1-bit of aggressor memory cell programming level information is used, the aggressor memory cells programming levels can be determined to either be high or low since those two categorizations can be represented with a single binary bit. In this example, an embodiment can include components that determine that the effects of the aggressor memory cell programmed to the low programming level may not need to be compensated for and can use the default PV voltage to program a specified memory cell adjacent to that aggressor memory cell regardless of the target programming level to which the specified memory cell is being programmed. Further, the embodiments can include components that determine that the PV voltage used to compensate for the effect of the specified memory cells caused by aggressor memory cells programmed to the high programming level should be X mV less than the default PV voltage used regardless of the target programming level to which the specified memory cell is being programmed. In the various embodiments, a different PV voltage can be used for each target programming level to which the specified memory cell is to be programmed.

Having grouped the specified memory cell programming levels into one group, the embodiments can include components that cycle through a pre-determined set of potential PV offset values the value that maximizes the RWB increase is found. Further, the value that results in the greatest RWB increase for the grouping can be compared to the maximum RWB increase (i.e., the RWB increase resulting from perfect compensation e.g., as calculated by using the Law of Total Variance, to determine the reduction of the spread of the $V_t$ distribution for a particular programming level) to determine whether the target RWB increase is achieved. If the greatest RWB increase that can be obtained using the chosen grouping of the specified cell programming levels is not equal to or greater than the target RWB increase, the embodiments of the disclosure can include components that divide the programming levels of the specified cell into more groups.

For example, having previously grouped the specified cell programming levels into one group, the embodiment can include components that proceed to group the programming levels into two groups. Each of the groups can have a different PV voltage offset associated with programming the specified memory cell to a programming level in the group. For example, programming levels 0-3 of a TLC memory cell can be grouped in to a first group and programming levels 4-7 can be grouped into a second group. Accordingly, to compensate for a given aggressor memory cell state, a corrective programming operation can involve offsetting the default PV used to program the specified memory cell to level 2 by Y mV (since level 2 is in the first group), and offsetting the default PV used to program the specified memory cell to level 5 by Z mV (since level 5 is in the second group). Each of the offsets can have a corresponding RWB increase for a set of cells of a wordline group. Similarly to the case when all the programming levels were grouped into one group, embodiments of the present disclosure can include components that cycle through a pre-determined set of potential PV offset values for each of the programming level groups until the value that provides the greatest RWB increase is found. Again, the embodiments can include components that compare the value that results in the greatest RWB increase for this grouping to the maximum RWB increase (i.e., the RWB increase resulting from perfect compensation) to determine whether the target RWB increase is achieved.

This process can end when the lowest number of programming level groups that achieves the target RWB increase is found. Alternatively, this process can repeat until all possible programming level groupings for the specified memory cell is exhausted. If all the possible groupings have been tried without reaching the desired RWB increase, then some components of the embodiments of the present invention can redefine the target RWB increase (e.g., by increasing the gap between the target RWB and maximum RWB achieved from perfect compensation) and perform the aforementioned process again. Accordingly, this entire approach can be repeated for each wordline group of a memory device to obtain the optimal specified cell programming level groupings for pre-compensation using PV voltage offsets.

Advantages of the embodiments of the present disclosure include, but are not limited to, mitigating the effects of C2C coupling and LM by utilizing less than perfect compensation. For example, a less resource intensive approach is implemented to reduce the time needed to complete the respective modified write operations. In the embodiments, the lower increase in RWB allows the use of fewer PV voltage offsets (e.g., corresponding to respective programming level groups) to result in the desired RWB gain. Thus, although in some of the embodiments the RWB increase can be lower than the maximum possible RWB increase achieved from perfect compensation, it is sufficient to achieve a desired improvement in performance (e.g., reduced BER). The several embodiments include components that conserve computing time and resources that would otherwise be wasted for achieving perfect compensation. Moreover, the embodiments require less memory space to store the parameters used to offset the PV voltages of the corrective programming operations. Accordingly, the embodiments disclosed herein improve the efficiency of remedial modifications to memory access operations that compensate for C2C coupling and LM effects by reducing the resources, time, and energy used to reach the desired RWB increase. These and other elements and features of the embodiments are described initially with reference to FIG. 1 and FIGS. 2A-2D below.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device The memory sub-system 110 includes a compensation management component (CMC) 113 that can optimize corrective programming operations for compensating C2C coupling and LM effects to achieve a target increase in a RWB for a set of cells in the memory device 130. In some embodiments, the memory sub-system controller 115 includes at least a portion of the CMC 113. In some embodiments, the CMC 113 is part of the host system 110, an application, or an operating system. In other embodiments, local media controller 135 includes at least a portion of CMC 113 and is configured to perform the functionality described herein.

The CMC 113 can determine parameters of memory access operations (e.g., write operations) performed on the memory cells of memory device 130 to compensate for the effects of C2C coupling and LM based on a programming level groupings to achieve a desired RWB increase. Further details with regards to the operations of the CMC 113 are described below with additional reference to FIGS. 2A-2D which depict an example memory cell arrangement, the effects of C2C coupling and LM, as well as example results of compensation.

Figures 2A, 2B:
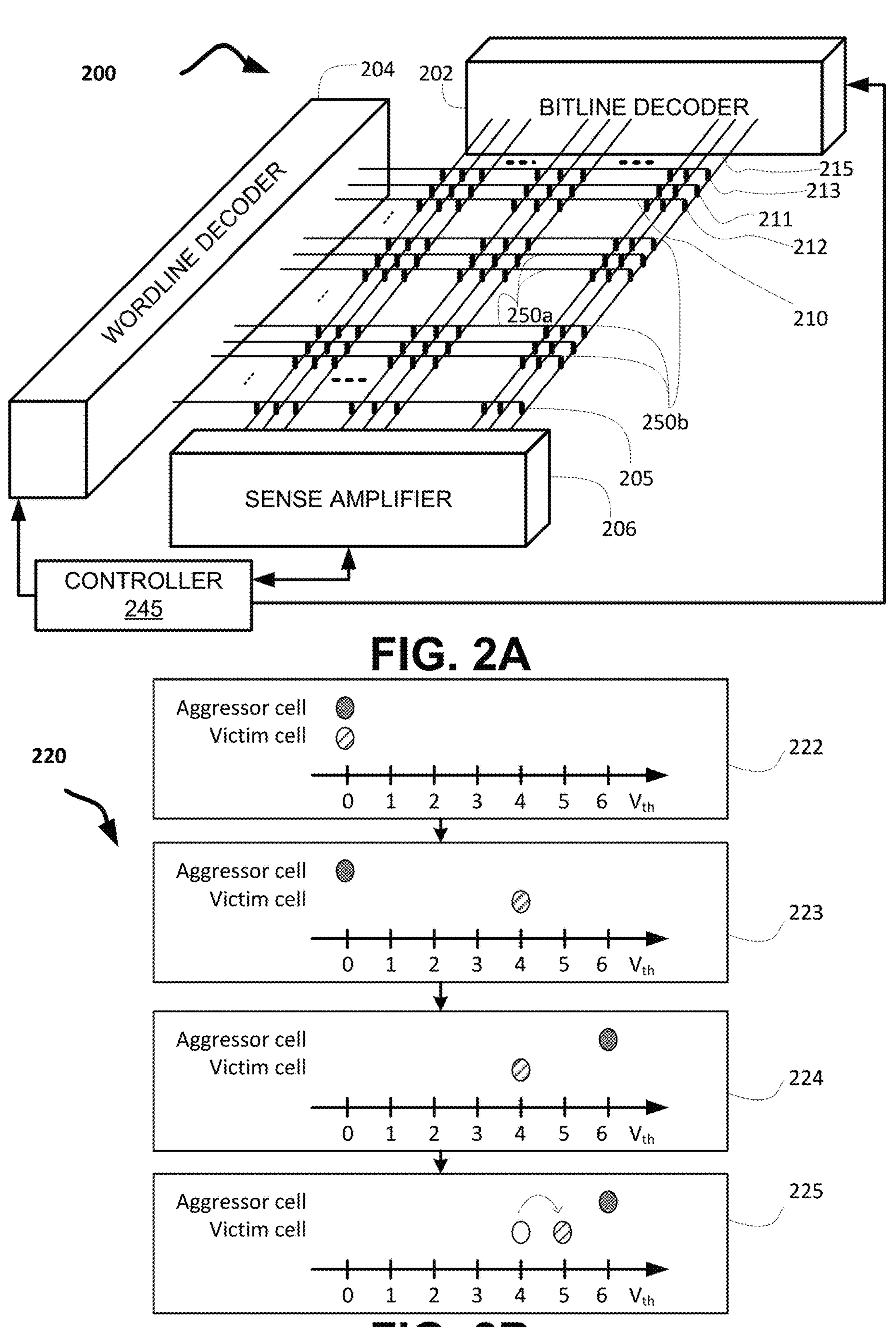
FIG. 2A illustrates an example array of memory cells in accordance with some embodiments of the present disclosure.
FIG. 2B is a flow chart showing the effects of an aggressor memory cell programming level on the threshold voltage of a victim memory cell in accordance with some embodiments of the present disclosure.

To further describe the features of CMC 113, consider an array 200 of multiple TLC memory cells 205, 211, 212, 213 illustrated in FIG. 2A in accordance with some embodiments of the present disclosure. Memory array 200 can include multiple wordlines 210 (e.g., row lines) and multiple bitlines 215 (e.g., column lines, pillars), labeled. In some embodiments, each row of memory cells 205, 211, 212, 213 is connected to a wordline 210, and each column of memory cells 205, 211, 212, 213 is connected to a bitline 215. Activating or selecting a wordline 210 or a bitline 215 can include applying a voltage to the respective lines.

Wordlines 210 and bitlines 215 can be substantially perpendicular (i.e., orthogonal) to one another or otherwise intersect one another to create an array of memory cells. As shown in FIG. 2A, one memory cell 212 can be located at the intersection of two conductive lines such as a wordline 210 and a bitline 215. This intersection can be referred to as an address of a memory cell 212. A specified memory cell 212 can be a memory cell 212 located at the intersection of an energized wordline 210 and bitline 215; that is, wordline 210 and bitline 215 can be energized to read, write, or otherwise access a memory cell 212 at their intersection. Other memory cells 205, 211, 213 that are in electronic communication with (e.g., connected to) the same wordline 210 or bitline 215 can be referred to as unspecified memory cells 205, 211, 213.

Electrodes can be coupled to a memory cell 205, 211, 212, 213 and a wordline 210 or a bitline 215. The term electrode can refer to an electrical conductor, and in some embodiments, can be employed as an electrical contact to a memory cell 205, 211, 212, 213. An electrode can include a trace, wire, conductive line, conductive layer, or the like that provides a conductive path between elements or components of memory device 130. In some examples, a memory cell 205, 211, 212, 213 can include multiple self-selecting or other memory components (e.g., a selection component and a storage component) separated from each other and from access lines 210, 215 by electrodes. For self-selecting memory cells 205, 211, 212, 213, a single component (e.g., a section or layer of chalcogenide material within the memory cell 205, 211, 212, 213) can be used as both a storage element (e.g., to store or contribute to the storage of a state of memory cell 205) and as a selector element (e.g., to select or contribute to the selection of the memory cell 205, 211, 212, 213).

In some embodiments, operations such as reading and writing can be performed on memory cells 205, 211, 212, 213 by activating or selecting a corresponding wordline 210 and bitline 215. Accessing memory cells 205, 211, 212, 213 can be controlled through a wordline decoder 204 and a bitline decoder 202. For example, a wordline decoder 204 can receive a row address from the memory controller 245 (which can be a version of memory sub-system controller 110 or CMC 113 of FIG. 1) and activate the appropriate wordline 210 based on the received row address. Such a process can be referred to as decoding a row or wordline address. Similarly, a bitline decoder 202 can receive a column address from the memory controller 245 and activate the appropriate bitline 215. Such a process can be referred to as decoding a column or bitline address. A wordline decoder 204 and/or bitline decoder 202 can be examples of decoders implemented using decoder circuitry, for example. In some embodiments, wordline decoder 204 and/or bitline decoder 202 can include circuitry that is configured to increase a voltage applied to a wordline 210 or bitline 215 (respectively).

In some embodiments, a memory cell 205, 211, 212, 213 can be read (e.g., sensed) by a sense amplifier 206 when the memory cell 205, 211, 212, 213 is accessed (e.g., in cooperation with the memory controller 245, wordline decoder 204, and/or bitline decoder 202) to determine a logic state stored by the memory cell 205, 211, 212, 213. The sense amplifier 206 can provide an output signal indicative of (e.g., based at least in part on) the logic state stored by the memory cell 205, 211, 212, 213 to one or more components (e.g., to the bitline decoder 202, the memory controller 245). In some embodiments, the detected logic state can be provided to a host system 120 (e.g., a device that uses the memory device 130 for data storage), where such signaling can be provided directly from the memory controller 245, memory sub-system controller 115, or CMC 113.

In some embodiments, sense amplifier 206 can include various transistors or amplifiers to detect and amplify a difference in signals obtained based on reading a memory cell 205, 211, 212, 213, which can be referred to as latching. The detected logic state of memory cell 205, 211, 212, 213 can then be output through bitline decoder 202 as output. In some embodiments, sense amplifier 206 can be part of a bitline decoder 202 or row decoder 120. Alternatively, sense amplifier 206 can be connected to or in electronic communication with bitline decoder 202 or wordline decoder 204.

In some embodiments, read/write/erase operations can be performed on memory cells 205, 211, 212, 213. The performance of such operations can be controlled by memory controller 245 (which can be a version of memory subsystem controller 110 or CMC 113 of FIG. 1). Accordingly, operations, such as write operations to be performed on memory array 200 can be distributed among the memory cells 205, 211, 212, 213. In one embodiment, the wordlines 210 can be grouped according to a value of a metric reflecting a property or characteristic of the memory cells of the group (e.g., a default voltage that needs to be applied to program the cells of the wordline to a particular programming level). For example, in the embodiment depicted in FIG. 2A, some of the wordlines 210 of array 200 can be grouped into a first group 250*a* that by default initially needs voltage X to program its cells to programing level 2, and a second group 250*b* that by default initially needs voltage Y to program its cells to programing level 2. Each of the groups can have a value of a metric that that reflects a property or characteristic of the memory cells in the group falling within a range of possible values. Accordingly, the wordlines 210 of array 200 can be grouped into multiple wordline groups based on the default PV voltage used for programming the cells connected to the wordlines in that wordline group to a given programming level.

In the several embodiments, these default values and other characteristics of the memory cells 205, 211, 212, 213 can be altered by the effects of C2C coupling and LM described above. Take for example, memory cell 211 that is specified to be accessed by a memory access operation (e.g. read/write) by specifying and activating the respective bitline and wordline at the intersection of which it is located. The specified wordline can be referred to as an n-th wordline ($WL_n$), and the adjacent wordlines can include adjacent wordline n−1 ($WL_{n-1}$) and adjacent wordline n+1 ($WL_{n+1}$). Thus, the specified cell 211 can have a respective group of adjacent cells. Each group of adjacent cells can include at least one cell that neighbors its respective specified cell (e.g., one cell 212 connected to $WL_{n-1}$ and/or one cell 213 connected to $WL_{n+1}$). Accordingly, the several embodiments can include one or more aggressor memory cells that are connected to respective wordlines such that each of those respective wordlines are adjacent to the specified memory cell (e.g., adjacent to the wordline to which the specified memory cell is directly connected).

The memory cells 205, 211, 212, 213 can be categorized into aggressor cells and victim cells. More specifically, an aggressor memory cell can be defined by an effect its programming level has on a threshold voltage of an adjacent memory cell. The adjacent cell can thus be defined as the victim cell as it is affected by the programming level of the aggressor cell. This categorization and relationship is depicted in the flow chart of FIG. 2B.

In the depicted example, example memory cell 211 can be subject to the effects of phenomena such as LM and C2C coupling. If memory cell 211 is subject to an effect of a programming level of its adjacent cell 212, then memory cell can be considered to be the victim cell 211 and the adjacent cell 212 can be considered to be the aggressor cell 212. Initially, at block 222, both cells have a $V_t$ of 0. When the victim cell 211 is programmed, at block 223, to have a $V_t$ of 4 v, it might not yet be affected by the programming level of the aggressor memory cell 212 since the aggressor memory cell 212 still has a $V_t$ of 0 v. Thereafter, the C2C coupling effect can become observable as the aggressor memory cell 212 is programmed at block 224 to have a $V_t$ of 6 v. As can be seen in block 225, the $V_t$ of the victim cell 211 can increase from 4 v to 5 v caused by the programming level corresponding to the aggressor memory cell's $V_t$ of 6 v due to C2C coupling. In a similar manner, the Vt of victim memory cell 211 can be affected by the programming level (i.e., by the corresponding $V_t$) of adjacent aggressor cell 213.

Thus, in the various embodiment the CMC 113 can compensate for the resulting distributions of $V_t$ of victim cells caused by aggressor cell programming levels. Take for example, a plot 230 of victim cell $V_t$ depicted in FIG. 2C in accordance with an embodiment of the disclosure. The example plot 230 of $V_t$ distributions is associated with of an example group of TLC memory cells (e.g., cells 205, 211, 212, 213) programmed to programming level 3. As can be seen, the overarching distribution 239 of $V_t$ for the cells programmed to programming level 3 includes multiple sub-distributions 231-238. Each of these sub-distributions 231-238 reflect the $V_t$ of victim cells programmed to level 3 that happen to have an adjacent aggressor memory cell programmed to a particular programming level that shifts the respective $V_t$ of the victim cell. For example, sub-distribution 231 is a distribution of $V_t$ that is not shifted because the adjacent aggressor cells of the victim cells in the distribution are programmed to programming level 0. In contrast, sub-distribution 232 is shifted due to aggressor memory cells programmed to programming level 1. Sub-distribution 233 is shifted due to aggressor memory cells programmed to programming level 2. Sub-distribution 234 is shifted due to aggressor memory cells programmed to programming level 3. Sub-distribution 235 is shifted due to aggressor memory cells programmed to programming level 4. Sub-distribution 236 is shifted due to aggressor memory cells programmed to programming level 5. Sub-distribution 237 is shifted due to aggressor memory cells programmed to programming level 6. Sub-distribution 238 is shifted due to aggressor memory cells programmed to programming level 7.

Accordingly, it can be seen how the $V_t$ distribution for a set of victim memory cells has sub-distributions of $V_t$ dependent on the programming level of aggressor memory cells. For example, the sub-distribution 238 is shifted to the right relative to the default sub-distribution 231 by a greater amount than sub-distribution 234. This is because the victim cells of sub-distribution 238 are adjacent to aggressor cells of a higher programming level (i.e., 7) than those of sub-distribution 234. Notably, variations of the depicted shifts that are shown for one victim cell programming level can also exist for other programming levels of the victim cell. The other programming levels of the victim cells can likewise be affected by the programming levels of adjacent aggressor cells and have corresponding shifts in their respective sub-distributions.

Figures 2C, 2D:
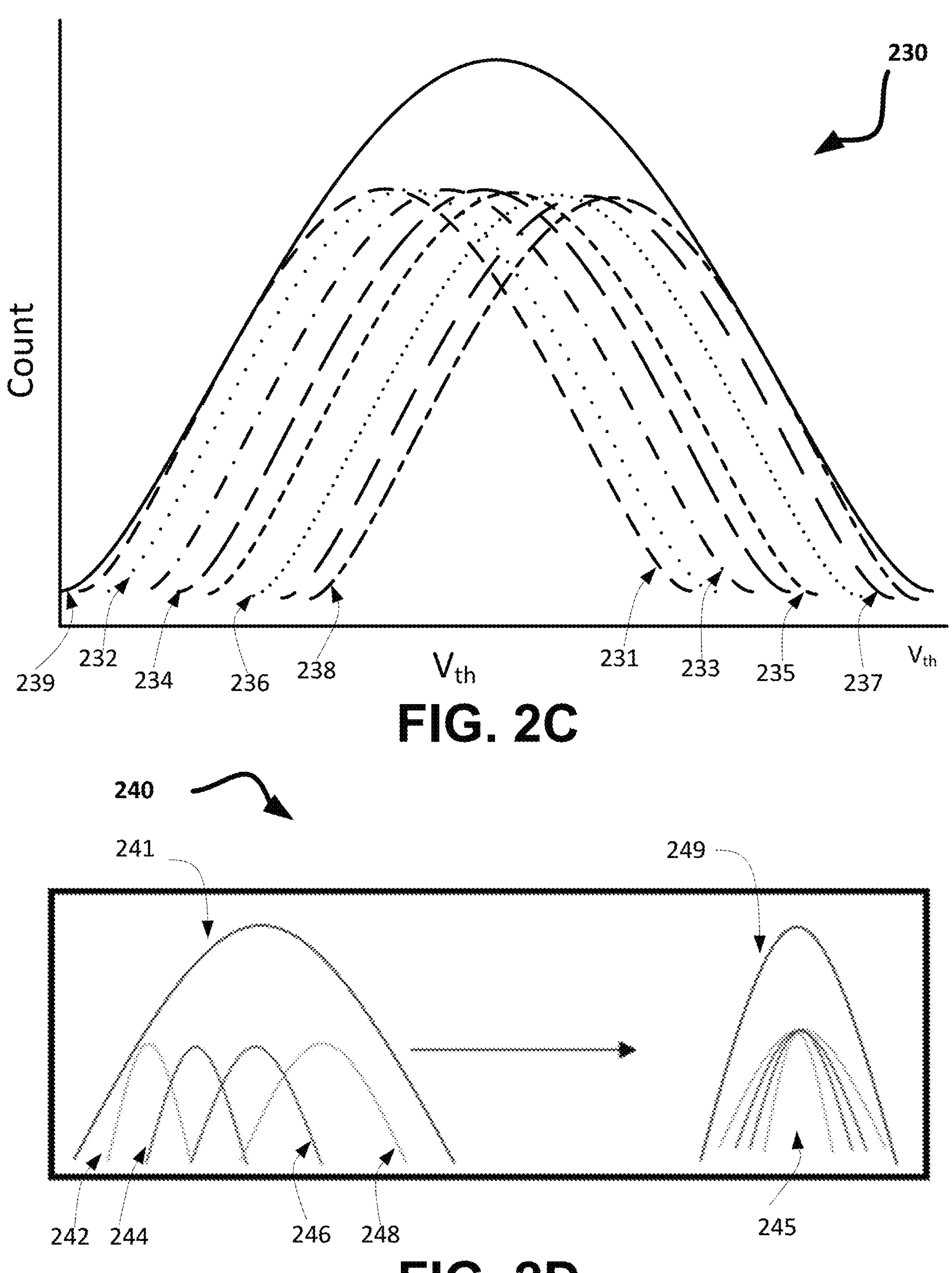
FIG. 2C illustrates an example threshold voltage distribution and its sub distributions in accordance with some embodiments of the present disclosure.
FIG. 2D depicts a plot of threshold voltage distribution and its sub distributions being aligned to narrow the distribution's spread in accordance with some embodiments of the present disclosure.

Thus, in some embodiments, CMC 113 can compensate for these $V_t$ shifts by taking these shifts into consideration when performing read or write operations on the specified memory cells. An example plot resulting from such compensation is depicted in FIG. 2D in accordance with an embodiment of the disclosure. For example, overarching $V_t$ distribution (i.e., for a set of victim memory cells at programming level N) can include sub distributions 242, 244, 246, 248. Each of the sub-distributions can be shifted by a different amount based on a corresponding aggressor cell programming level. In some embodiments, CMC 113 can compensate for every one of these $V_t$ shifts that can be caused by every possible corresponding aggressor memory cell programming level and thereby achieve perfect compensation. Perfect compensation can include CMC 113 adjusting the parameters of these operations (e.g., by adjusting one or more voltages that are applied) to align the means of the sub-distributions to a single value 245 and thereby narrow the overarching original distribution 241 to the resulting distribution 249. Narrowing the spread of the overarching distribution caused an increase in the RWB.

In some embodiments, to compensate for the shifts, CMC 113 can perform corrective read operations. For example, the CMC 113 can adjust the read reference voltages applied during the read operations by offsetting the read reference voltages by an amount corresponding to the shift. This can entail ensuring that a read reference voltage falls within a valley between distributions and does not inadvertently fall within one of the shifted sub-distributions. Similarly, in other embodiments, CMC 113 can perform corrective programming operations. For example, CMC 113 can adjust PV voltages applied during write operations by an amount corresponding to the shift. This can entail the adjustment of PV voltages to correspond to the resulting voltage distribution of the specified cells when the aggressor cells' effects (e.g., C2C coupling) are taken into consideration. Accordingly, perfect compensation involves compensating for every one of the possible shifts and corresponding shift scenarios. Consequently, it will also result in the maximum possible RWB increase.

Because each shift depends on a particular programming level of an aggressor memory cell, a larger number of possible aggressor memory cell programming levels will entail a larger number of possible shifts to be accounted for. As noted earlier, the aggressor memory cell programming levels can be encoded in or reflected by a sufficient number of bits. For example, 1 bit of information is sufficient to reflect all the possible programming level for an SLC aggressor memory cell. In contrast, to reflect all the possible programming level for a TLC aggressor memory cell, 3 bits of information can be needed. Thus, the CMC 113 can use a corresponding number of bits of aggressor memory cell state information for compensation.

Furthermore, in some embodiments, the CMC 113 need not perfectly compensate for every possible shift, but can instead partially compensate for them by using fewer bits of aggressor memory cell state information. The CMC can group the aggressor memory cell programming levels into groups such that the number of groups reflects that number of bits of aggressor memory cell information needed to determine the group into which an aggressor memory cell falls. For example, the 8 possible programming levels of a TLC memory cell can be grouped into two groups by placing programming levels 1-4 (i.e., representing a relatively low programing level) into group 1 and programming levels 5-8 (i.e., representing a relatively high programing level) into group 2. In this manner, the programming level of a TLC cell can be reflected using 1 bit of information instead of 3 bits. Based on the grouping, CMC 113 can partially compensate for the aforementioned shift by adjust the memory access operations in accordance with the number of bits of aggressor memory cell information that are being used. For example, instead of compensating for each possible shift, the shifts caused by programming levels in group 1 can be partially compensated with one voltage offset while the shifts caused by programming levels in group 2 can be partially compensated by another voltage offset.

Consequently, in some embodiments, the CMC 113 can use more bits of aggressor memory cell state information to achieve a greater RWB increase and use fewer bits of aggressor memory cell state information to achieve a lesser RWB increase. To do this, the CMC 113 can group the aggressor memory cell programming levels into a corresponding number of groups depending on the number of bits of aggressor memory cell stat information that are to be used for compensation.

Notably, the RWB increase achieved with compensation is directly correlated with the time and computing resources required to achieve it. In other words, the higher the number of bits of aggressor memory cell state information used by the CMC 113 for compensation, the higher the resulting RWB gain and the longer it takes. Accordingly, since in some embodiments each memory cell is located adjacent to one or more corresponding aggressor memory cells, the CMC 113 using a higher number of bits of aggressor memory cell state information entails a correspondingly larger cost of the compensation.

Similarly, in some embodiments, the CMC 113 need not perfectly compensate for the shifts at every possible programming level of a specified memory cell since storing the parameters of the corrective programming operation for such compensation becomes prohibitive as the number of cells and programming levels to which it is applied increases. Accordingly, in some embodiments, the CMC 113 can group the programming levels into groups and apply the same PV offset when programming the memory cells to any of the programming levels within a particular group to achieve a desired RWB increase. In this manner, even without perfect compensation, the CMC 113 can optimize compensation for each wordline group 250*a*, 250*b* on the memory device 130.

In some embodiments, the CMC 113 can identify multiple wordline groups on the memory device where each wordline group is associated with a corresponding default program verify (PV) voltage for each respective programming level of a memory cell. For example, a wordline group can include wordlines connected to memory cells that are programmed to programming level L by using default PV voltage V. Another wordline group can include wordlines connected to memory cells that are programmed to programming level M by using default PV voltage W. For example, a TLC cell can have eight programming levels and, consequently, have seven respective default PV voltages (since level 0 representing an erased state of the memory cell does not need to be programmed). The CMC 113 can identify wordline groups such that the memory cells connected to the wordlines in each particular group have a common default PV voltage for programming the memory cells to at least one of the possible programming levels.

Further, in several embodiments, the CMC 113 can determine, for each wordline group, a maximum read window budget (RWB) increase. Naturally, since the maximum RWB is achieved with perfect compensation, the maximum RWB increase can be associated with using a different PV voltage offset for each respective programming level of a memory cell. For example, each programming level of a specified memory cell can have a different PV voltage offset used during a corrective programming operation to account for possibly different C2C coupling and LM effects at each of those different programming levels. Accordingly, in some embodiments, each PV voltage offset can depend on a respective aggressor memory cell threshold voltage (the effects of which it is intended to counteract).

In some embodiments, the CMC 113 can define a target aggregate RWB increase amount based on the maximum RWB increase. For example, in one embodiment, a target RWB increase can be defined in terms of a range of voltage values relative to the maximum RWB increase (e.g., target RWB increase defined to be within N mV of the maximum RWB increase achieved with perfect compensation). Similarly, in another embodiment, a target RWB increase can be defined in terms of a percentage relative to the maximum RWB increase (e.g., target RWB increase defined to be equal to or greater than 70% of the maximum RWB increase achieved with perfect compensation).

In several embodiments, the CMC 113 can then determine how to group the programming levels most efficiently to achieve the desired RWB increase. To do this, the CMC can calculate the minimum number of programming level groups that can be used to achieve the target RWB increase. For example, in some embodiments, the CMC 113 can determine, for each wordline group, a minimum number of memory cell programming level groups, such that each programming level group is associated with a corresponding PV voltage offset applied for programming a memory cell to any programming level within the programming level group, where the minimum number is sufficient to reach the target aggregate RWB increase amount. The aggregate RWB increase can include the sum of RWB increases achieved for programming multiple different cells to multiple different programming levels. In some embodiments, the CMC 113 determining the minimum number of memory cell programming level groups can be an iterative process. For examples, determining the minimum number can include the CMC 113 dividing multiple memory cell programming levels into a first set of programming level groups having a first number (e.g., 1) of programming level groups. For each group of the first set of programming level groups, the CMC 113 can assign a respective PV voltage offset to the programming level group corresponding to a greatest RWB increase for that programming group. In other words, the CMC 113 can, by cycling through a pre-determined list of PV voltage offsets, determine the PV voltage offset that, when used to program the cells to one of the programming levels within the programming level group, yields the greatest RWB increase.

Then, the CMC 113 can determine whether the target aggregate RWB increase amount is reached using the respective PV voltage offsets for each group of the first set of programming level groups. If the target aggregate RWB increase amount is reached, then the CMC 113 can select that grouping as the desired minimum number. For example, in response to the CMC 113 determining that the target aggregate RWB increase amount is reached, the CMC 113 can select the first number of programming level groups as the minimum number of programming level groups. However, in some cases, the grouping that was initially considered might not be adequate if the greatest RWB increase that results from that grouping does not reach the target aggregate RWB increase. Accordingly, in some embodiments, in response to the CMC 113 determining that the target aggregate RWB increase amount is not reached using the respective PV voltage offsets for each programming level group of the first set of programming level groups, the CMC 113 can divide multiple memory cell programming levels into a second set of programming level groups having a second number (e.g., 2) of programming level groups different from the first number of programming level groups. The CMC 113 can then repeat the previously described determination of whether or not the target aggregate RWB increase is reached using corresponding PV voltage offsets for each of the respective programming level groups in the second set.

The CMC 113 can continue increasing the number of programming level groups into which the programming levels of a specified cell can be divided into and checking whether the particular grouping results in the desired RWB increase. In some cases, each programming level group can include a predefined minimum number of programming levels. For example, the CMC 113 can be configured to group the programming levels into groups of no less than two programming levels each. Further, the CMC 113 determining the minimum number of memory cell programming level groups can eventually, after repeated iterations of the abovementioned process, reach a set of groups such that each programming level is grouped into a separate programming level group. Accordingly, in some embodiments, when the CMC has grouped the programming levels into a number of programming level groups that is equivalent to the total number of memory cell programming levels for a memory cell the CMC 113 can determine whether perfect compensation by PV voltage adjustment during corrective programming yields the desired RWB increase. In these embodiments, the CMC 113 can determine whether the target aggregate RWB increase amount is reached using the respective PV voltage offsets for each programming level group of this set of programming level groups. If the target aggregate RWB increase amount is reached, then the CMC 113 can select that grouping as the desired minimum number. For example, in response to the CMC 113 determining that the target aggregate RWB increase amount is reached, the CMC 113 can select that number (i.e., the number of groups in the latest iteration) of programming level groups as the minimum number of programming level groups. Further, in response to the CMC 113 determining that the target aggregate RWB increase amount is not reached using the respective PV voltage offsets for each group of the latest set of programming level groups, the CMC 113 can redefine the target aggregate RWB increase amount based on the maximum RWB increase. For example, the CMC can define the target RWB increase in terms of a different range of values (e.g., within M mV) or a different percentage (e.g., ≥60%) relative to the maximum RWB increase obtained from perfect compensation.

Having determined the minimum number of programming level groups that will result in the desired RWB increase, the CMC 113 can proceed to grouping the programming levels. For example, the CMC 113 can group the programming levels of a specified memory cell into the minimum number of programming level groups determined for the wordline group containing the wordline connected to the specified memory cell to define the specific programming level groups. Note that each programming level group will have a corresponding PV voltage offset that is used during a corrective programming operation to program a memory cell to one of the programming levels in that programming level group. Accordingly, in some embodiments, the CMC 113 can apply, based on the specific programming level group containing the target programming level (i.e., the programming level to which the cell is desired to be programmed), a corresponding PV voltage offset during a memory cell access operation (e.g., a write operation) to program the specified memory cell to the target programming level. In this manner, a fewer number of PV voltage offsets can be used to compensate for the C2C coupling and LM effects and achieve the target desired aggregate RWB increase. The benefits and advantages of the various embodiments disclosed herein are described in more detail with reference to methods depicted in FIGS. 3-5.

FIG. 3 is a flow diagram of an example method 300 for managing program verify (PV) voltage offsets in memory devices in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the CMC 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In some embodiments, the method 300 can be applied to a memory device having multiple victim cells and aggressor memory cells in one or more arrays. The aggressor memory cells can be defined as aggressors relative to specified memory cells that can be defined as victims based on the effect that the programming level of the aggressor cells has on a threshold voltage adjacent victim memory cells. Each memory cell can be connected to a wordline with physical characteristics that determine a default PV voltage that is used to program the cells connect to that wordline to a particular programming level. Therefore, in some embodiments, the processing logic can, at block 302, identify multiple wordline groups on the memory device where each wordline group is associated with a corresponding default program verify (PV) voltage for each respective programming level of a memory cell. For example, a TLC cell can have eight programming levels and, consequently, have seven respective default PV voltages (since level 0 representing an erased state of the memory cell does not need to be programmed). The processing logic, at block 302, can identify wordline groups such that the memory cells connected to the wordlines in each particular group have a common default PV voltage for programming the memory cells to at least one of the possible programming levels.

Further, in several embodiments, the processing logic can, at block 304, determine, for each wordline group, a maximum read window budget (RWB) increase. Because the maximum RWB is achieved with perfect compensation, the maximum RWB increase determined at block 304 can be associated with using a different PV voltage offset for each respective programming level of a memory cell. For example, each programming level of a specified memory cell can have a different PV voltage offset used during a corrective programming operation to account for possibly different C2C coupling and LM effects at each of those different programming levels. Accordingly, in some embodiments, each PV voltage offset can depend on a respective aggressor memory cell threshold voltage (the effects of which the offset of the PV voltage is intended to account for).

In some embodiments, the processing logic can, at block 306, define a target aggregate RWB increase amount based on the maximum RWB increase. For example, the processing logic can, at block 306, define a target RWB increase in terms of a range of voltage values relative to the maximum RWB increase (e.g., target RWB increase defined to be within L mV of the maximum RWB increase achieved with perfect compensation). Similarly, the processing logic can, at block 306, define a target RWB increase in terms of a percentage relative to the maximum RWB increase (e.g., target RWB increase defined to be equal to or greater than 80% of the maximum RWB increase achieved with perfect compensation). At block 308, the processing logic can then determine how to group the programming levels most efficiently to achieve the desired RWB increase. More specifically, the processing logic can calculate, at block 308, the minimum number of programming level groups that can be used to achieve the target RWB increase. For example, at block 308, the processing logic can determine, for each wordline group, a minimum number of memory cell programming level groups, such that each programming level group is associated with a corresponding PV voltage offset applied for programming a memory cell to any programming level within the programming level group, where the minimum number is sufficient to reach the target aggregate RWB increase amount. The aggregate RWB increase can include the sum of RWB increases achieved for programming multiple different cells to multiple different programming levels.

Using the determined the minimum number of programming level groups that will result in the desired RWB increase, the processing logic can proceed to grouping the programming levels at block 310. In some embodiments, the processing logic can, at block 310, group the programming levels of a specified memory cell into the minimum number of programming level groups determined for the wordline group containing the wordline connected to the specified memory cell to define the specific programming level groups. In some cases, each programming level group can have a corresponding PV voltage offset that is used during a corrective programming operation to program a memory cell to one of the programming levels in that programming level group. Thus, at block 312, the processing can apply, based on the specific programming level group containing the target programming level (i.e., the programming level to which the cell is desired to be programmed), a corresponding PV voltage offset during a memory cell access operation (e.g., a write operation) to program the specified memory cell to the target programming level. In this manner, a fewer number of PV voltage offsets can be used to compensate for the C2C coupling and LM effects and achieve the target desired aggregate RWB increase. The determination of the minimum number of memory cell programming level groups in block 308 is described in more detail below with reference to FIG. 4.

Figure 4:
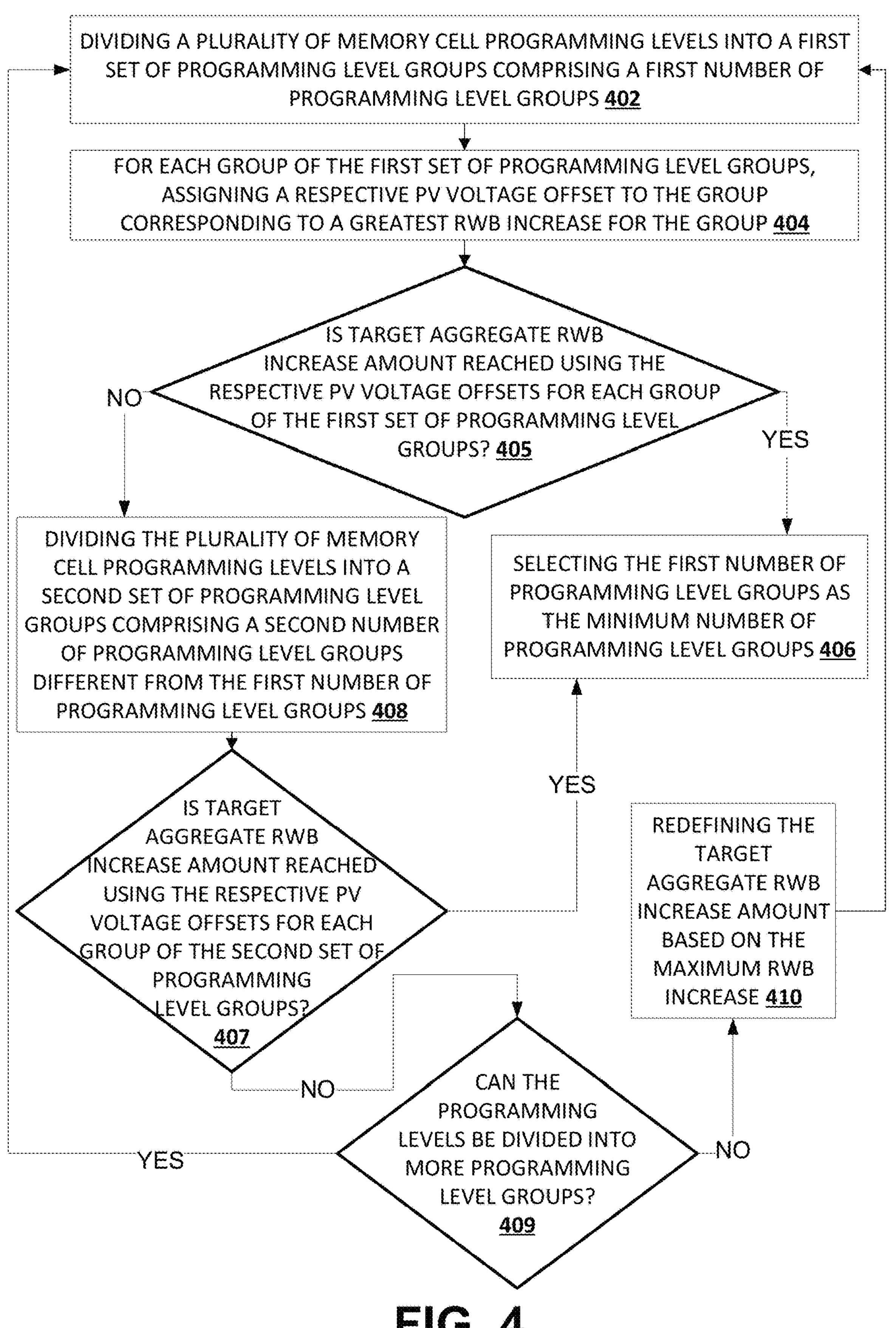
FIG. 4 is a flow diagram of an example method for determining a minimum number of programming level groups in accordance with some embodiments of the present disclosure.

FIG. 4 is a flow diagram of an example method 400 for determining a minimum number of programming level groups in accordance with some embodiments of the present disclosure and further describes in more detail the operations of block 308 of FIG. 3. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the CMC 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Determining the minimum number of memory cell programming level groups to use can include an iterative process. Accordingly, in some embodiments, at block 402, the processing logic can initially divide multiple memory cell programming levels into a first set of programming level groups having a first number (e.g., 2) of programming level groups. For each group of the first set of programming level groups, the processing logic can, at block 404, assign a respective PV voltage offset to the programming level group corresponding to a greatest RWB increase for that programming group. In some cases, by cycling through a predetermined list of PV voltage offsets, the processing logic can determine the PV voltage offset that, when used to program the cells to one of the programming levels within the programming level group, will result in the greatest RWB increase.

Further, at block 405, the processing logic can determine whether the target aggregate RWB increase amount is reached using the respective PV voltage offsets for each group of the first set of programming level groups. If the target aggregate RWB increase amount is reached, then the processing logic can, at block 406, select that grouping as the desired minimum number. For example, in response to determining that the target aggregate RWB increase amount is reached, the processing logic can, at block 406, select the first number of programming level groups as the minimum number of programming level groups. However, in some cases, the grouping that was initially checked might not be satisfactory if the greatest RWB increase that results from that grouping does not reach the target aggregate RWB increase. Accordingly, in response determining that the target aggregate RWB increase amount is not reached using the respective PV voltage offsets for each programming level group of the first set of programming level groups, the processing logic can, at block 408, divide the multiple memory cell programming levels into a second set of programming level groups that has a second number (e.g., 3) of programming level groups different from the first number of programming level groups. The processing logic can then, at block 407, repeat the previously described determination from block 405, of whether or not the target aggregate RWB increase is reached using corresponding PV voltage offsets for each of the respective programming level groups in the second set. In some cases, each programming level group can include a predefined minimum number of programming levels (e.g., no less than two programming levels each).

Accordingly, at block 407, the processing logic can determine whether the target aggregate RWB increase amount is reached using the respective PV voltage offsets for each programming level group of this (e.g., second) set of programming level groups. If the processing logic determines, at block 407, that target aggregate RWB increase amount is reached, then the processing logic can proceed to select, at block 406, that grouping as the desired minimum number. For example, in response to the processing logic determining, at block 407, that the target aggregate RWB increase amount is reached, the processing logic can select, at block 406, that number (i.e., the number of groups in the latest iteration) of programming level groups as the minimum number of programming level groups. However, if the processing logic determines, at block 407, that the target aggregate RWB increase amount is not reached using the respective PV voltage offsets for each group of the latest set of programming level groups, the processing logic can then, in response determine, at block 409, whether the programming levels can be further divided into more groups. In response to determining that the programming levels can be divided into more groups, the processing logic can proceed to perform another iteration of the abovementioned process repeating from block 402.

However, after repeated iterations of the abovementioned process, the processing logic can reach a set of groups such that each programming level is grouped into a separate programming level group. Accordingly, in some embodiments, when the processing logic, at block 408, has grouped the programming levels into a number of programming level groups that is equivalent to the total number of memory cell programming levels for a memory cell the processing logic can, at block 407, determine whether perfect compensation by PV voltage adjustment during corrective programming yields the desired RWB increase. Thus, in response to determining, at blocks 407-409, that the target aggregate RWB increase is not reached and that the programming levels cannot be divided into more groups, the processing logic can, at block 410, redefine the target aggregate RWB increase amount based on the maximum RWB increase. For example, the processing logic can define the target RWB increase in terms of a different range of values (e.g., within W mV) or a different percentage (e.g., ≥55%) relative to the maximum RWB increase obtained from perfect compensation. The processing logic can then proceed to block 406 and iteratively continue increasing the number of programming level groups into which the programming levels of a specified cell can be divided into and checking whether the particular grouping results in the desired RWB increase.

FIG. 5 is a flow diagram of an example method 500 for managing PV voltage offsets in memory devices in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the CMC 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In the various embodiments, each deviation of a threshold voltage corresponding to a particular programming level of a specified memory cell can be accounted for by a specific PV voltage offset during a corrective programming operation to achieve a maximum possible RWB increase (i.e., by perfect compensation). Accordingly, at block 502, the processing logic can determine, for a wordline group of a memory device, a maximum read window budget (RWB) increase associated with using a different program verify (PV) voltage offset for each deviation of a respective programming level voltage threshold of a memory cell, where each deviation depends on a respective aggressor memory cell threshold voltage.

In some embodiments, the processing logic can, at block 504, defining a target aggregate RWB increase amount by a portion (e.g., a fraction or percentage) of the maximum RWB increase. Further, at block 506, the processing logic can determine, for the wordline group, a minimum number of memory cell programming level groups that is sufficient to reach the target aggregate RWB increase amount under the assumption that a different PV offset voltage is used for each programming level group.

In some embodiments, determining the minimum number at block 506 can include the processing logic consecutively dividing the multiple memory cell programming levels into an iteratively larger corresponding number of programming level groups. In some embodiments, each programming level group can be associated with a corresponding PV voltage offset applied for programming a memory cell to each programming level within the programming level group. Further, determining the minimum number at block 506 can also include the processing logic determining, for each iteratively larger corresponding number of programming level groups, whether the target aggregate RWB increase amount is reached by using the corresponding PV voltage for each programming level group.

In several embodiments, responsive to determining, for a first iteratively larger corresponding number of programming level groups, that the target aggregate RWB increase amount is reached, the processing logic can, at block 506, select the corresponding number as the minimum number of memory cell programming level groups. However, in response to determining, for a number of programming level groups equivalent to a total number of memory cell programming levels for one memory cell, that the target aggregate RWB increase amount is not reached, the processing logic can, at block 506, redefine the target aggregate RWB increase amount by a smaller proportion of the maximum RWB increase.

Further, the processing logic can, at block 508, identify one or more memory cell programming level groups into which the programming levels of a specified memory cell can be divided such that the total number of memory cell programming level groups is the minimum number of memory cell programming level groups determined for the wordline group containing the wordline to which the specified memory cell is connected. In some embodiments, the processing logic can, at block 510, perform a memory cell access operation, based on the programming level group containing the target programming level, using the corresponding PV voltage offset, to program the specified memory cell to the target programming level.

Figure 6:
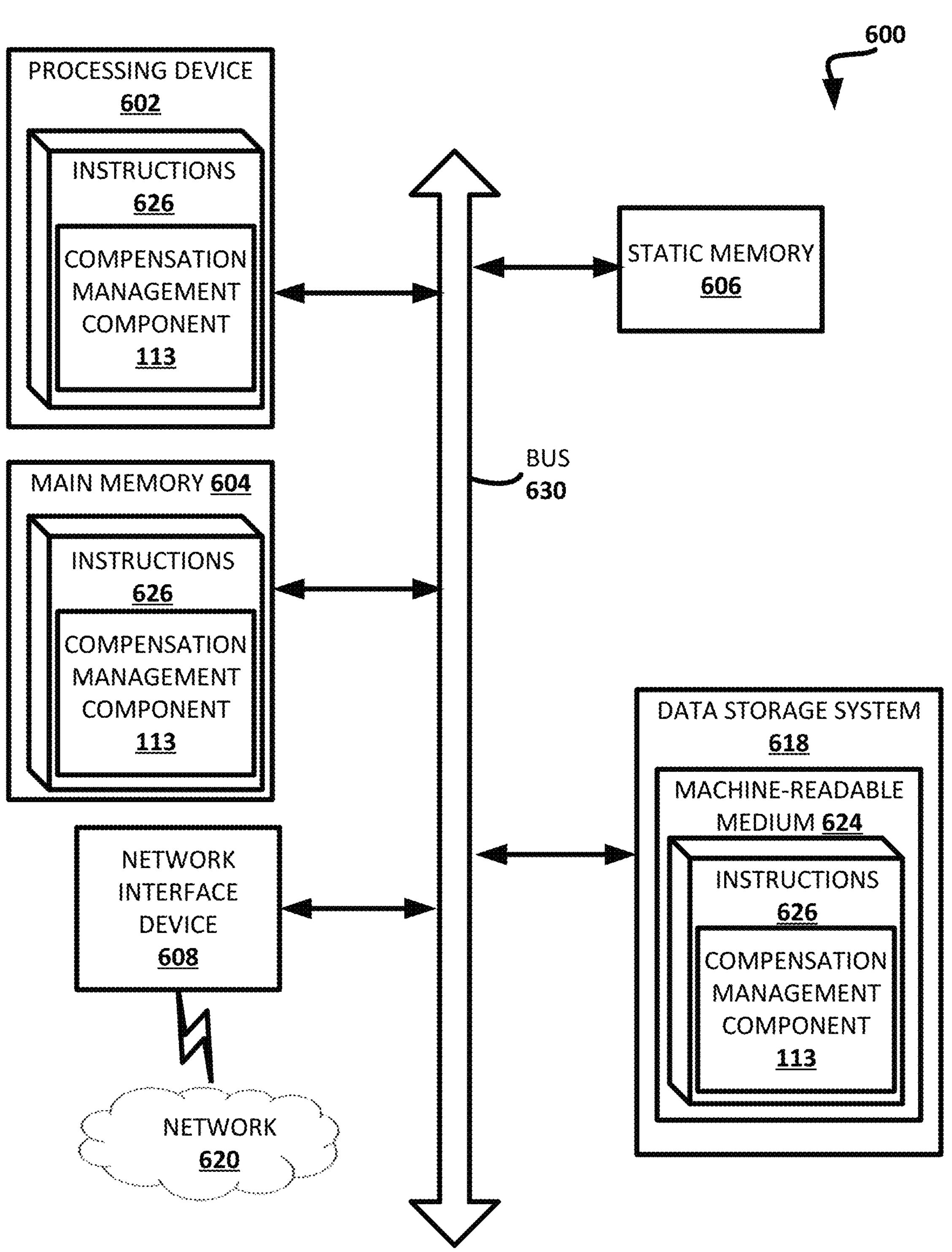
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the CMC 113 of FIG. 1, to method 300 of FIG. 3, to method, 400 of FIG. 4, or to method 500 of FIG. 5.). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a compensation management component (e.g., the CMC 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system, comprising:

a memory device comprising a plurality of memory cells; and a processing device, operatively connected to the memory device, to perform operations comprising:

identifying a plurality of wordline groups on the memory device;

determining, for each wordline group, a maximum read window budget (RWB) increase associated with using, for each respective programming level of a memory cell of the plurality of memory cells, a corresponding program verify (PV) voltage offset;

defining a target aggregate RWB increase amount based on the maximum RWB increase;

dividing a plurality of memory cell programming levels into a set of programming level groups, each programming level group in the set of programming level groups being associated with a corresponding PV voltage offset that is applied for programming a memory cell to any programming level within the programming level group;

grouping the programming levels of a specified memory cell into a chosen number of programming level groups; and applying, based on one or more specific programming level groups containing a target programming level, a corresponding PV voltage offset during a memory cell access operation to program the specified memory cell to the target programming level.

2. The system of claim 1, wherein the operations further comprise:

dividing the plurality of memory cell programming levels into a first set of programming level groups comprising a first number of programming level groups;

for each group of the first set of programming level groups, assigning a respective PV voltage offset to the group corresponding to a greatest RWB increase for the group;

determining whether the target aggregate RWB increase amount is reached using the respective PV voltage offsets for each group of the first set of programming level groups;

responsive to determining that the target aggregate RWB increase amount is not reached using the respective PV voltage offsets for each programming level group of the first set of programming level groups, dividing the plurality of memory cell programming levels into a second set of programming level groups comprising a second number of programming level groups different from the first number of programming level groups.

3. The system of claim 2, wherein the operations further comprise:

responsive to determining that the target aggregate RWB increase amount is reached, selecting the first number of programming level groups as the chosen number of programming level groups.

4. The system of claim 2, wherein the second number of programming level groups is equivalent to a total number of memory cell programming levels for one memory cell and wherein the processing device is further to perform the operations comprising:

determining whether the target aggregate RWB increase amount is reached using the respective PV voltage offsets for each programming level group of the second set of programming level groups;

responsive to determining that the target aggregate RWB increase amount is not reached using the respective PV voltage offsets for each group of the second set of programming level groups, redefining the target aggregate RWB increase amount based on the maximum RWB increase.

5. The system of claim 2, wherein each programming level group comprises a predefined number of programming levels.

6. The system of claim 1, wherein a magnitude of each respective PV voltage offset depends on a number of bits of information reflecting a threshold voltage of one or more aggressor memory cells.

7. The system of claim 1, wherein the corresponding one or more aggressor memory cells are connected to respective wordlines that are each adjacent to the memory cell.

8. A method, comprising:

identifying, by a processing device, a plurality of wordline groups on a memory device comprising a plurality of memory cells;

determining, for each wordline group, a maximum read window budget (RWB) increase associated with using, for each respective programming level of a memory cell of the plurality of memory cells, a corresponding program verify (PV) voltage offset;

defining a target aggregate RWB increase amount based on the maximum RWB increase;

dividing a plurality of memory cell programming levels into a set of programming level groups, each programming level group in the set of programming level groups being associated with a corresponding PV voltage offset that is applied for programming a memory cell to any programming level within the programming level group;

grouping the programming levels of a specified memory cell into a chosen number of programming level groups; and applying, based on one or more specific programming level groups containing a target programming level, a corresponding PV voltage offset during a memory cell access operation to program the specified memory cell to the target programming level.

9. The method of claim 8, further comprising:

dividing the plurality of memory cell programming levels into a first set of programming level groups comprising a first number of programming level groups;

for each group of the first set of programming level groups, assigning a respective PV voltage offset to the group corresponding to a greatest RWB increase for the group;

determining whether the target aggregate RWB increase amount is reached using the respective PV voltage offsets for each group of the first set of programming level groups;

responsive to determining that the target aggregate RWB increase amount is not reached using the respective PV voltage offsets for each programming level group of the first set of programming level groups, dividing the plurality of memory cell programming levels into a second set of programming level groups comprising a second number of programming level groups different from the first number of programming level groups.

10. The method of claim 9, further comprising:

responsive to determining that the target aggregate RWB increase amount is reached, selecting the first number of programming level groups as the chosen number of programming level groups.

11. The method of claim 9, wherein the second number of programming level groups is equivalent to a total number of memory cell programming levels for one memory cell and wherein the processing device is further to perform the operations comprising:

determining whether the target aggregate RWB increase amount is reached using the respective PV voltage offsets for each programming level group of the second set of programming level groups;

responsive to determining that the target aggregate RWB increase amount is not reached using the respective PV voltage offsets for each group of the second set of programming level groups, redefining the target aggregate RWB increase amount by a larger range of values relative to the maximum RWB increase.

12. The method of claim 9, wherein each programming level group comprises a predefined number of programming levels.

13. The method of claim 8, wherein a magnitude of each respective PV voltage offset depends on a number of bits of information reflecting a threshold voltage of one or more aggressor memory cells.

14. The method of claim 8, wherein the corresponding one or more aggressor memory cells are connected to respective wordlines that are each adjacent to the memory cell.

15. A non-transitory computer-readable storage medium comprising executable instructions that, when executed by a processing device, cause the processing device to perform operations comprising:

identifying a plurality of wordline groups on a memory device comprising a plurality of memory cells;

determining, for each wordline group, a maximum read window budget (RWB) increase associated with using, for each respective programming level of a memory cell of the plurality of memory cells, a corresponding program verify (PV) voltage offset;

defining a target aggregate RWB increase amount based on the maximum RWB increase;

dividing a plurality of memory cell programming levels into a set of programming level groups, each programming level group in the set of programming level groups being associated with a corresponding PV voltage offset that is applied for programming a memory cell to any programming level within the programming level group;

grouping the programming levels of a specified memory cell into a chosen number of programming level groups; and applying, based on one or more specific programming level groups containing a target programming level, a corresponding PV voltage offset during a memory cell access operation to program the specified memory cell to the target programming level.

16. The non-transitory computer-readable storage medium of claim 15, wherein the operations further comprise:

consecutively dividing the plurality of memory cell programming levels into an iteratively larger corresponding number of programming level groups, each programming level group associated with a corresponding PV voltage offset applied for programming a memory cell to each programming level within the programming level group, and determining, for each iteratively larger corresponding number of programming level groups, whether the target aggregate RWB increase amount is reached by using the corresponding PV voltage for each programming level group.

17. The non-transitory computer-readable storage medium of claim 16, wherein the operations further comprise:

responsive to determining, for a first iteratively larger corresponding number of programming level groups, that the target aggregate RWB increase amount is reached, selecting the corresponding number as the chosen number of memory cell programming level groups.

18. The non-transitory computer-readable storage medium of claim 16, wherein the operations further comprise:

responsive to determining, for a number of programming level groups equivalent to a total number of memory cell programming levels for one memory cell, that the target aggregate RWB increase amount is not reached, redefining the target aggregate RWB increase amount by a smaller proportion of the maximum RWB increase.

19. The non-transitory computer-readable storage medium of claim 15, wherein each programming level group comprises a predefined number of programming levels.

20. The non-transitory computer-readable storage medium of claim 15, wherein each memory cell and a corresponding aggressor memory cell are respectively connected to adjacent wordlines.

* * * * *